US 6,732,326 B2

(12) United States Patent
Choi et al.

(10) Patent No.: US 6,732,326 B2
(45) Date of Patent: May 4, 2004

(54) STRUCTURE AND METHOD FOR DEPUNCTURING PUNCTURED CODES FOR RADIX-4 BRANCH METRIC CALCULATION IN HIGH-SPEED VITERBI DECODER

(75) Inventors: Eun-A Choi, Chunju (KR); Jin-Ho Kim, Taejon (KR); Nae-Soo Kim, Taejon (KR); Deock-Gil Oh, Taejon (KR)

(73) Assignee: Electronics and Telecommunications Research Institute (KR)

( * ) Notice: Subject to any disclaimer, the term of this patent is extended or adjusted under 35 U.S.C. 154(b) by 458 days.

(21) Appl. No.: 09/846,477

(22) Filed: Apr. 30, 2001

(65) Prior Publication Data

US 2002/0083397 A1 Jun. 27, 2002

(30) Foreign Application Priority Data

Dec. 27, 2000 (KR) .......................................... 2000-83017

(51) Int. Cl.[7] ...................... H03M 13/41; H03M 13/25; H03M 13/29
(52) U.S. Cl. .......................... 714/790; 714/795; 714/796
(58) Field of Search ................................. 714/795–796, 714/790

(56) References Cited

U.S. PATENT DOCUMENTS

| | | | |
|---|---|---|---|
| 5,438,590 A | 8/1995 | Tzukerman et al. | 375/259 |
| 5,668,820 A | 9/1997 | Ramesh et al. | 371/43.1 |
| 5,790,566 A | 8/1998 | Laskowski | 371/30 |
| 5,970,104 A | * 10/1999 | Zhong et al. | 375/341 |
| 2002/0095639 A1 | * 7/2002 | Ahmed et al. | 714/786 |

OTHER PUBLICATIONS

Black, P. J. and Meng, T. H.—Y., "A 140Mb/s 32–State Radix–4 Viterbi Decoder", 1992 International Solid–State Circuits Conference, pp. 70–71, 247, Feb. 1992.*
A 140–Mb/s, 32–State, Radix–4 Viterbi Decoder, *IEEE Journal of Solid–State CircuiTes*, Vol 27, No. 12, Dec. 1992, pp. 1877–1885.
Novel Viterbi Decoder VLSI Implementation and its Performance, *IEEE Transactions on Communications*, vol. 41, No. 8, Aug. 1993, pp. 1170–1178.

* cited by examiner

Primary Examiner—R. Stephen Dildine
(74) Attorney, Agent, or Firm—Seed IP Law Group PLLC

(57) ABSTRACT

A structure and a method for depuncturing an input bit stream being input to a Viterbi decoder when the Viterbi decoder is designed by using a Radix-4 branch metric calculator in a method for designing the Viterbi decoder that decodes a punctured code at a high-speed, are disclosed. A depuncture structure for Radix-4 branch metric calculation in a high-speed Viterbi decoder includes four FIFOs, four multiplexers, and one Radix-4 branch metric calculator. Two input bit streams of I and Q are connected to two upper FIFOs and two lower FIFOs. An output terminal of FIFO is connected to upper and lower multiplexers of the next stage. One output terminal of each multiplexer is connected to Radix-4 branch metric calculator. As a result, Radix-4 branch metric calculation can be achieved by using the same clock as a clock speed of the input I and Q bit streams. This structure and this method can be applied to a depuncturing process for Radix-4 branch metric calculation of all punctured codes derived from ½ code.

8 Claims, 10 Drawing Sheets

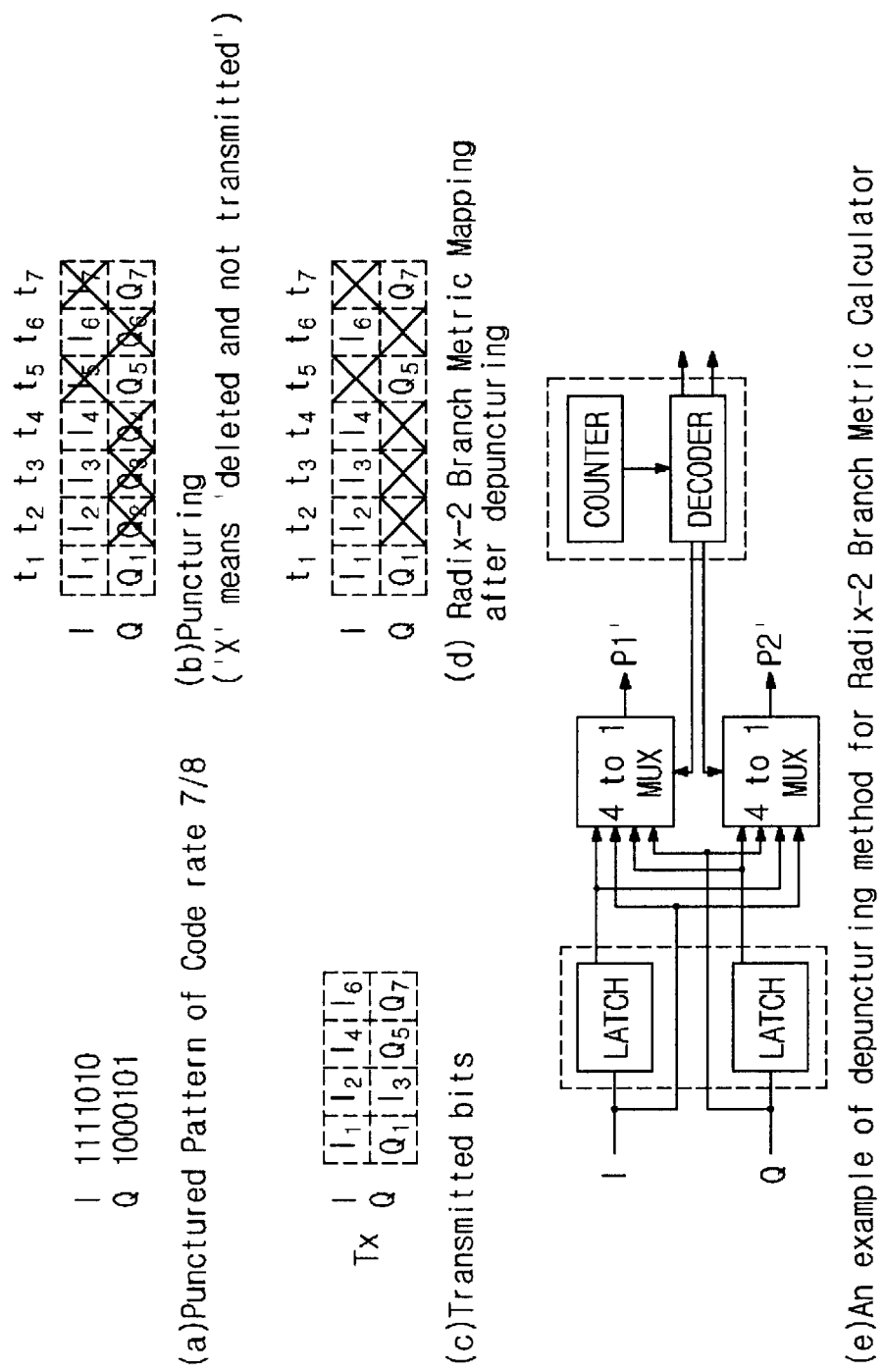

Concept Diagram of Depuncture Scheme

Select Signal of MUXi

Radix-2 Branch Metric Calculator with Depuncture Position Signals

Detailed Bolck Diagram of ADDER$_{PUNC}$

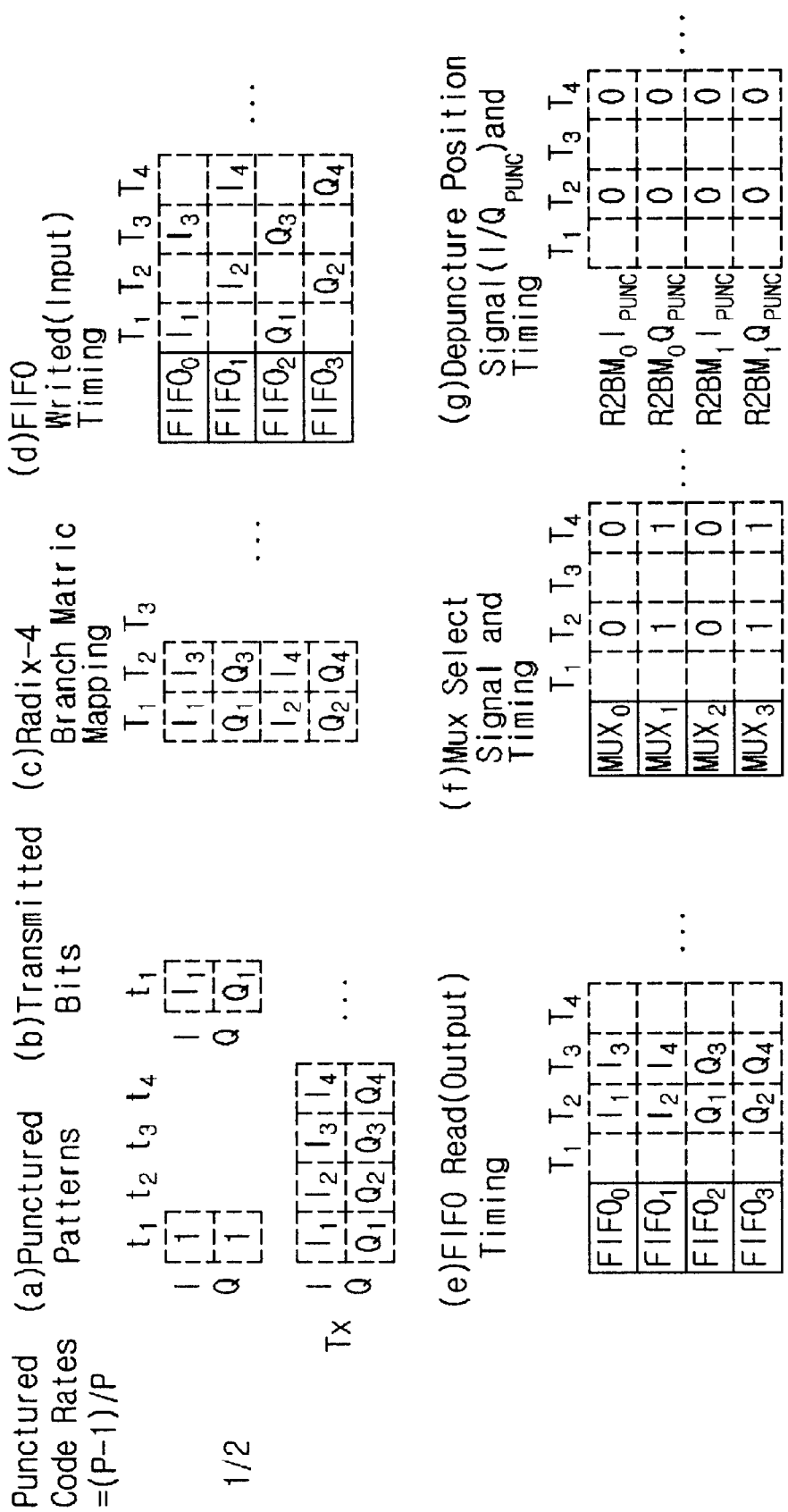

FIG. 7

Punctured Code Rates =(P-1)/P

(a) Punctured Patterns & Transmitted Bits

7/8

|   | $t_1$ | $t_2$ | $t_3$ | $t_4$ | $t_5$ | $t_6$ | $t_7$ |
|---|---|---|---|---|---|---|---|
| I | $I_1$ | $I_2$ | $I_3$ | $I_4$ | X | $I_6$ | X |
| Q | $Q_1$ | X | X | X | $Q_5$ | X | $Q_7$ |

Tx

| I | $I_1$ | $I_2$ | $I_4$ | $I_6$ | ... |
|---|---|---|---|---|---|
| Q | $Q_1$ | $I_3$ | $Q_5$ | $Q_7$ | |

(b) Radix-4 Branch Matric Mapping

|   | $T_1$ | $T_2$ | $T_3$ | $T_4$ | $T_5$ | $T_6$ | $T_7$ |
|---|---|---|---|---|---|---|---|
|   | $I_1$ | $I_3$ | X | X | $I_2$ | $I_4$ | $I_6$ |
|   | $Q_1$ | X | $Q_5$ | $Q_7$ | X | X | X |
|   | $I_2$ | $I_4$ | $I_6$ | $I_1$ | $I_3$ | X | X |
|   | X | X | X | $Q_1$ | X | $Q_5$ | $Q_7$ |

...

(c) FIFO Writed(Input) Timing AND
(d) FIFO Read(Output) Timing

|   | $T_1$ | $T_2$ | $T_3$ | $T_4$ | $T_5$ | $T_6$ | $T_7$ | $T_8$ |
|---|---|---|---|---|---|---|---|---|
| FIFO$_0$ | $I_1$ |  | $I_4$ |  |  |  |  |  |
| FIFO$_1$ |  | $I_2$ |  | $I_6$ |  |  |  |  |
| FIFO$_2$ | $Q_1$ |  | $Q_5$ |  |  |  |  |  |
| FIFO$_3$ |  | $I_3$ |  | $Q_7$ |  |  |  |  |

| | | | | | | | | |
|---|---|---|---|---|---|---|---|---|
| FIFO$_0$ | $I_1$ | $I_4$ |  | $I_1$ | $I_4$ |  |  |  |
| FIFO$_1$ | $I_2$ | $I_6$ |  | $I_2$ | $I_6$ |  |  |  |
| FIFO$_2$ | $Q_1$ | $Q_5$ | $Q_1$ | $Q_5$ |  |  |  |  |
| FIFO$_3$ |  | $I_3$ | $Q_7$ | $I_3$ | $Q_7$ |  |  |  |

(e) Mux Select Signal and Timing AND
(f) Depuncture Position Signal($I/Q_{PUNC}$) and Timing

|   | $T_1$ | $T_2$ | $T_3$ | $T_4$ | $T_5$ | $T_6$ | $T_7$ | $T_8$ |
|---|---|---|---|---|---|---|---|---|
| MUX$_0$ | 00 | 11 | XX | XX | 01 | 00 | 00 |  |
| MUX$_1$ | 10 | XX | 10 | 11 | XX | XX | XX |  |
| MUX$_2$ | 01 | 00 | 01 | 00 | 11 | XX | XX |  |
| MUX$_3$ | XX | XX | XX | 10 | XX | 11 | 11 |  |

| | | | | | | | | |
|---|---|---|---|---|---|---|---|---|
| R2BM$_0$ $I_{PUNC}$ | 0 | 0 | 1 | 1 | 0 | 0 | 0 |  |
| R2BM$_0$ $Q_{PUNC}$ | 0 | 1 | 0 | 0 | 1 | 1 | 1 |  |
| R2BM$_1$ $I_{PUNC}$ | 0 | 0 | 0 | 0 | 0 | 1 | 1 |  |
| R2BM$_1$ $Q_{PUNC}$ | 1 | 1 | 1 | 0 | 1 | 0 | 0 |  |

STRUCTURE AND METHOD FOR DEPUNCTURING PUNCTURED CODES FOR RADIX-4 BRANCH METRIC CALCULATION IN HIGH-SPEED VITERBI DECODER

TECHNICAL FIELD

The present invention relates to a method for designing a Viterbi decoder that decodes a punctured code at a high speed. More particularly, it relates to a structure and a method for depuncturing an input bit stream being input to a Viterbi decoder when the Viterbi decoder is designed by using a Radix-4 branch metric calculator.

BACKGROUND OF THE INVENTION

Punctured codes are made of a code having a low code rate such as ½, ⅓ and the like. Such punctured codes were first introduced in the year 1979. An academic paper made by Yasuda in the year 1984 has introduced a punctured code including an original code rate of ½, constraint length of 3~9, and a code rate of ⅔~¹³⁄₁₄. After developing the punctured code made by Yasuda, a possibility of an actual implementation of the punctured code appeared.

By using a punctured code of ⅞ code rate derived from a code having both ½ code rate and a constraint length of 7 in an error control code for DVB satellite transmission system and a digital satellite broadcasting in Korea, it would be understood that a practicality of the punctured code is certainly verified.

At present, many companies for manufacturing a semiconductor are producing a Viterbi decoder that has an original code rate of ½, a punctured code rate of ⅔~⅞, and an operation speed of tens of mega bit per seconds (Mbps). However, due to a limitation of a semiconductor integration technique and a Viterbi decoding technique based on Radix-2 branch metric calculator, a method for depuncturing a punctured code was based on Radix-2.

After that, an academic paper that discloses a Viterbi decoder of ½ code including a constraint length '6' was introduced in 1992. Here, the Viterbi decoder uses Radix-4 branch metric calculator, and is operated at a class of 140 Mbps. Accordingly, there is a need for designing a high-speed Viterbi decoder using Radix-4 branch metric calculator even in the punctured codes.

The reason why the Radix-4 branch metric calculator on behalf of Radix-2 branch metric calculator is employed is to ultimately enhance a decoding speed of Viterbi decoder by increasing the number of bits processed in a unit time in the Viterbi decoder. Although the Radix-4 branch metric calculator has a longer Input/Output calculation time as compared to the Radix-2 branch metric calculator, the Radix-4 branch metric calculator can obtain a faster Viterbi decoding speed as compared to the Radix-2 branch metric calculator under the condition that a total delay time of the Radix-4 branch metric calculator is below twice a total delay time of Radix-2 branch metric calculator, because the Radix-4 branch metric calculator can process 2-bits at one time. Therefore, by using the Radix-4 branch metric calculator, an improved Viterbi decoder operating at a high speed higher than that of the prior Viterbi decoder using the Radix-2 branch metric calculator can be implemented.

Since a problem of the depuncturing method relates to an implementation technique rather than a research object, the academic paper did not handle the problem of the depuncturing method as an important matter. A depuncturing method for a Viterbi decoder using Radix-2 branch metric calculator was registered as a Patent technique in the years 1995 and 1998. However, up to now, a depuncturing method for a Viterbi decoder using Radix-4 branch metric calculator is not shown in a Patent Publication document or other research documents.

FIG. 1 is an example of a depuncturing method for Radix-2 branch metric calculator, wherein the example relates to a code including an original code rate '½', a constraint length '7', and a punctured code rate '⅞'.

Referring to FIG. 1, FIG. 1(a) shows ⅞ punctured pattern, and indicates that parts of a punctured pattern '0' are punctured and not transmitted. A detailed description about a puncturing process is shown in FIG. 1(b). FIG. 1(c) indicates an actual transmission bit after the puncturing process. FIG. 1(d) is provided to calculate a branch metric in the Radix-2 branch metric calculator after depuncturing a received punctured code. In FIG. 1(d), a mark 'X' indicates a punctured part of a transmitter, and the Radix-2 branch metric calculator considers this X zone as a dummy and does not perform a metric calculation in the X zone.

The depuncturing method relates to how to reorder the transmitted bits shown in FIG. 1(c) as an arrangement format of FIG. 1(d). One among conventional methods already registered as United States Patent is shown in FIG. 1(e) for implementing the depuncturing method by using two delay elements and two multiplexers having four input terminals and one output terminal (called 4:1 multiplexer). Here, the delay element stores a bit that is not currently used after being received.

A depuncturing method according to a conventional method is as follows. A currently received bit and a delay element's output bit being delayed by one clock are connected to an input terminal of a muiltiplexer. The two multiplexers are used to output a depunctured bit, and select an output bit by regulating a selection signal about four input terminals of each multiplexer. It should be understood that output signals of the two multiplexers are regarded as a bit mapping corresponding to FIG. 1(d). The punctured part can be controlled by preventing that output signals of the multiplexers are transmitted to a decoder. In order to apply this method in a Radix-4 branch metric calculator, two 4:1 multiplexers should be added to a construction of FIG. 1(e), a control signal for operating a delay element, a selection signal of the multiplexer, and a processing signal of the punctured part should be properly changed.

In case of using a depuncturing method shown in FIG. 1(e) in Radix-4 branch metric calculator, the number of delay elements excepting the two delay elements should be first examined. For an input operation of the Radix-4 branch metric calculator receiving four input signals, two multiplexers should be added to the construction of FIG. 1(e), thereby preparing four multiplexers in total. In addition, a control signal for controlling output signal of the four multiplexers should be properly made.

As stated above, since the conventional art such as FIG. 1(e) does not consider applying a depuncturing method to Radix-4 branch metric calculator, applying the conventional art to Radix-4 branch metric calculator signifies is meaningless.

SUMMARY OF THE INVENTION

Accordingly, the present invention is directed to a structure and a method for depuncturing the punctured codes for Radix-4 branch metric calculation that substantially obviate one or more of the problems due to limitations and disadvantages of the related art.

It is an object of the present invention to provide a structure and a method for depuncturing an input bit stream being input to a Viterbi decoder when the Viterbi decoder is designed by using a Radix-4 branch metric calculator.

To achieve these and other advantages and in accordance with the purpose of the present invention, as embodied and broadly described, a depuncture structure for Radix-4 branch metric calculation in a high-speed Viterbi decoder includes:

first and second FIFOs for sequentially receiving I-signal, and storing the I-signal;

third and fourth FIFOs for sequentially receiving Q-signal, and storing the Q-signal;

first and second multiplexers for receiving output signals of the first and third FIFOs, and multiplexing them;

third and fourth multiplexers for receiving output signals of the second and fourth FIFOs, and multiplexing them;

a first Radix-2 branch metric calculator for receiving output signals of the first and second multiplexers, and performing a depuncturing function about them; and a second Radix-2 branch metric calculator for receiving output signals of the third and fourth multiplexers, and performing a depuncturing function about them.

In another aspect, a depuncture method for Radix-4 branch metric calculation in a high-speed Viterbi decoder including four FIFOs, four multiplexers, and two Radix-2 branch metric calculators, includes the steps of:

(a) arranging a puncture pattern of a code rate (n−1)/n transmitting a punctured bit of n bits about an input of (n−1) bit in two rows I and Q, and periodically transmitting the puncture pattern arranged in the I and Q rows;

(b) sequentially receiving I-signal and Q-signal of the puncture pattern, alternately storing the I-signal and the Q-signal in two FIFOs, and simultaneously reading a data from the four FIFOs when the data is stored in the four FIFOs;

(c) multiplexing the data read from the four FIFOs, and outputting the data; and (d) receiving the multiplexed data, and performing Radix-2 branch metric calculation about the multiplexed data.

Additional features and advantages of the invention will be set forth in the description which follows, and in part will be apparent from the description, or may be learned by practice of the invention. The objectives and other advantages of the invention will be realized and attained by the scheme particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The embodiments of the present invention will be explained with reference to the accompanying drawings, in which:

FIG. 1 is an example of a depuncture structure for Radix-2 branch metric calculation according to the prior art;

FIGS. 3 to 7 illustrate a detailed construction of the depuncture structure for Radix-4 branch metric calculation according to the present invention.

DETAILED DESCRIPTION OF THE INVENTION

Reference will now be made in detail to the preferred embodiments of the present invention, examples of which are illustrated in the accompanying drawings.

A structure and a method for depuncturing the punctured codes for Radix-4 branch metric calculation in a high-speed Viterbi decoder according to the preferred embodiment of the present invention will be described in the following.

FIGS. 2A to 2E are a depuncture structure for Radix-4 branch metric calculation according to the present invention.

Figure 2A:
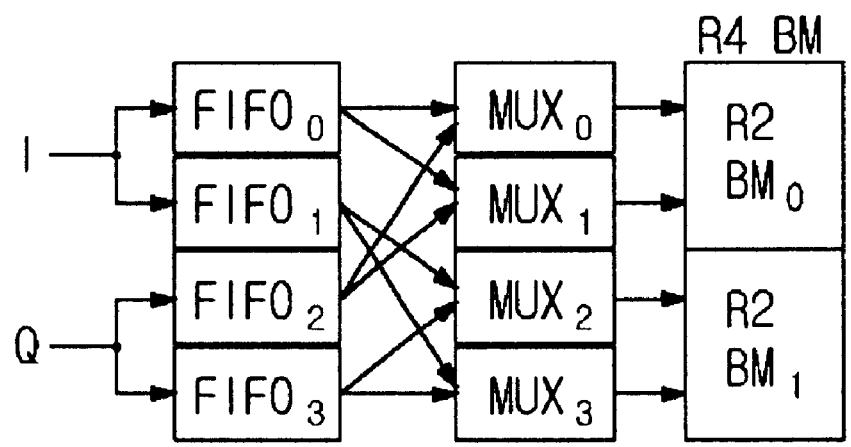
FIGS. 2A to 2E are a depuncture structure for Radix-4 branch metric calculation according to the present invention.
Figure 2B:
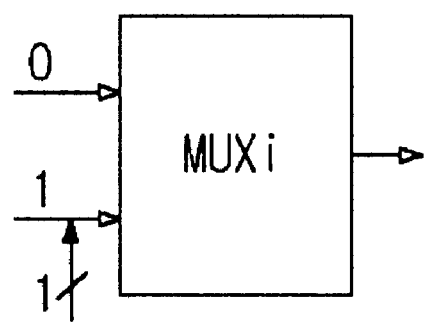

Referring to FIG. 2A, a depuncture structure includes four FIFOs and four 2:1 multiplexers including two input terminals and one output terminal. Two input signals being input to the 2:1 multiplexer are selected by an input selection signal of a multiplexer. If an input selection signal is '0' as shown in FIG. 2B, an upper input signal two input signals is selected and outputted. If an input selection signal is '1', a lower input signal two input signals is selected and outputted.

Figure 2C:
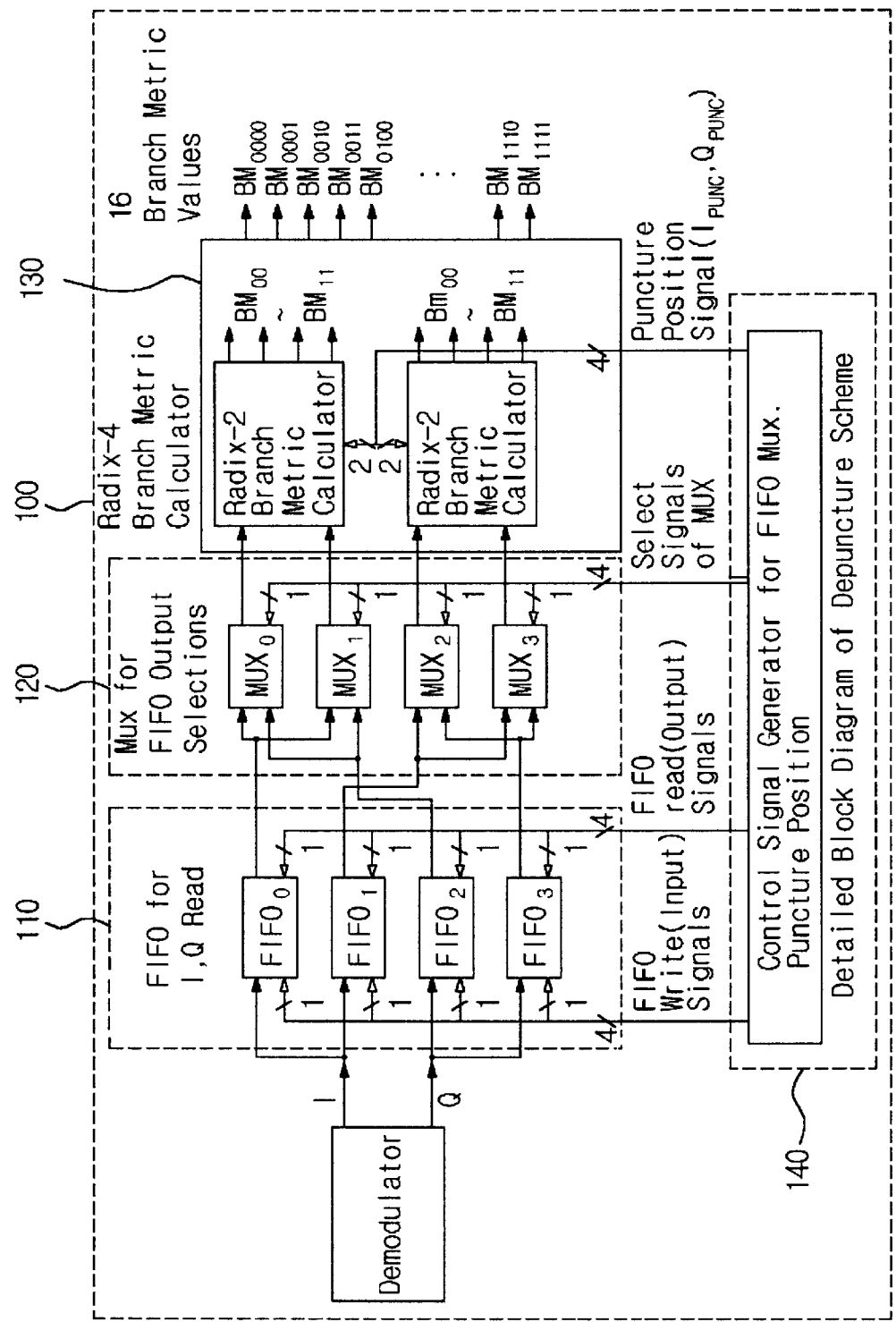

A detailed diagram of the depuncture structure is shown in FIG. 2C. As shown in FIG. 2C, a depuncture structure includes four FIFOs 110, four 2:1 multiplexers 120, and a Radix-4 branch metric calculator 130. In addition, the depuncture structure further includes a control signal generator 140 that outputs four control signals for controlling a writing action of the four FIFOs 110, four control signals for controlling a reading action of the four FIFOs 110, four input selection signals for selecting an input action of the four 2:1 multiplexers 120, and four control signals for selecting a punctured bit position in the Radix-4 branch metric calculator 130. The Radix-4 branch metric calculator 130 is comprised of two Radix-2 branch metric calculators.

Figure 2D:
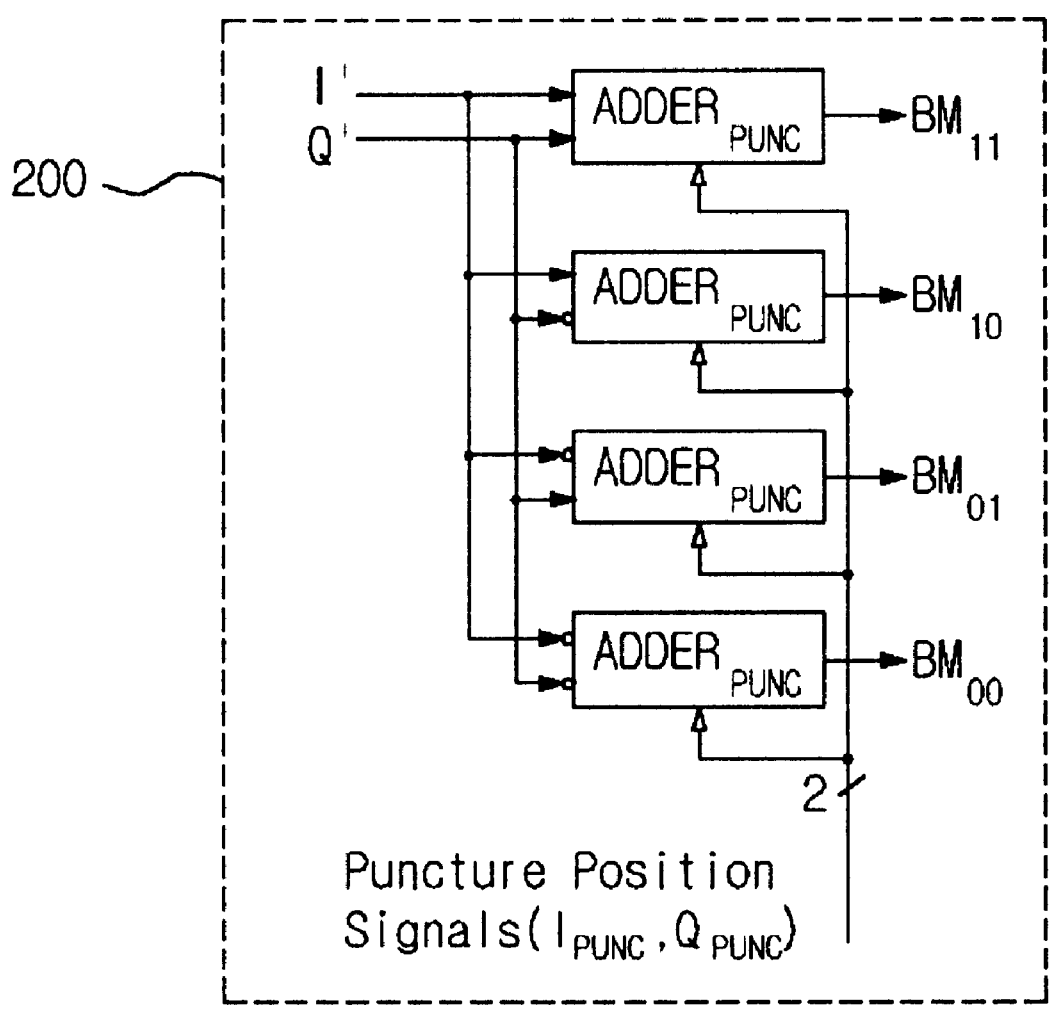

FIG. 2D is a block diagram illustrating a construction of Radix-2 branch metric calculator 200 positioned in the Radix-4 branch metric calculator. This Radix-2 branch metric calculator is comprised of four adders, and two puncture position signals are connected to each adder.

Figure 2E:
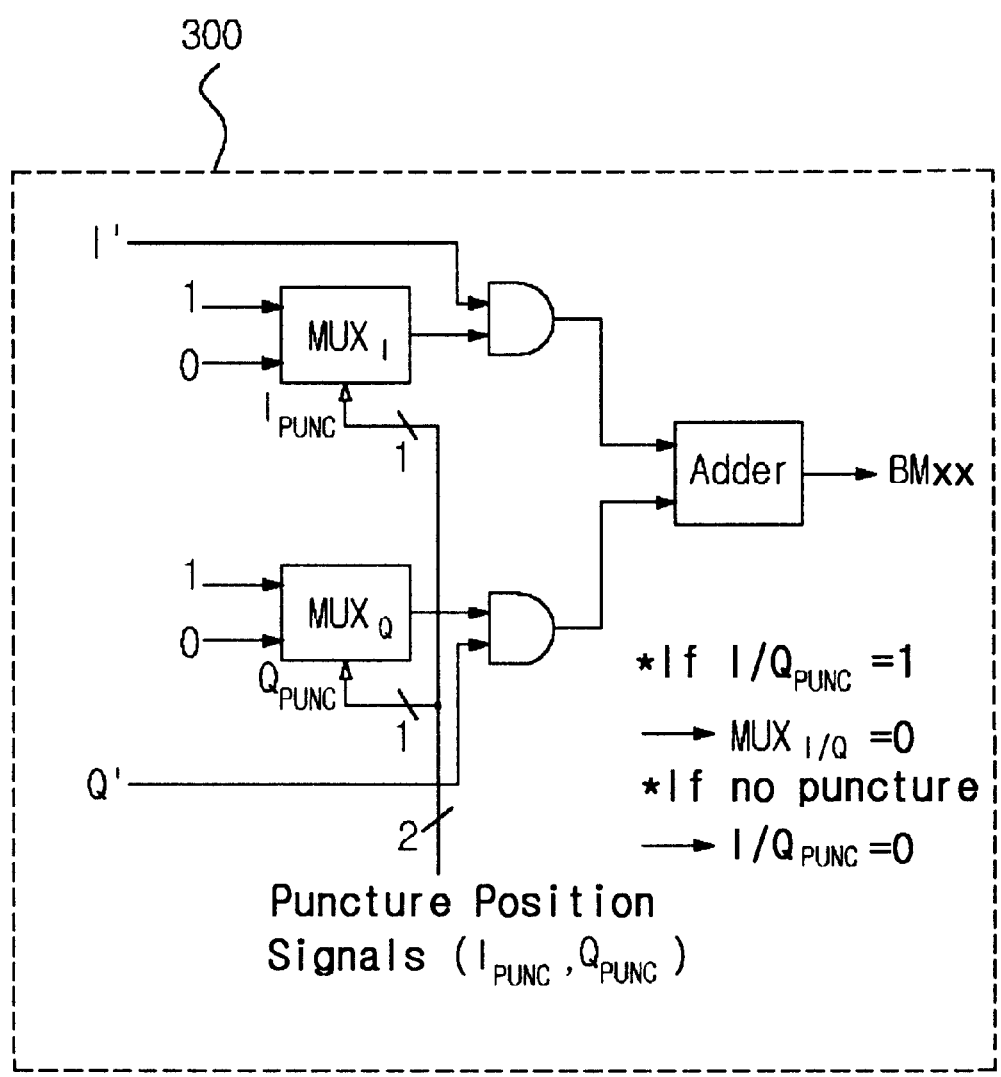

FIG. 2E is a detailed diagram of each adder shown in FIG. 2D. The adder allows a value of a puncture generation part between I and Q signals to be '0' in order to prevent that the puncture generation part affects a branch metric calculation.

A data generated from a demodulator is divided into two bit streams I and Q, and is then input to the upper two FIFOs and the lower two FIFOs. Four FIFOs receive I-signal and Q-signal according to a writing control signal of each FIFO. A data written in each FIFO is outputted at a proper timing point according to a reading control signal of each FIFO, and is connected to the 2:1 multiplexer. The data connected to the 2:1 multiplexer is generated from each multiplexer according to a selection signal of each multiplexer, and is transmitted to Radix-4 branch metric calculator. Two Radix-2 branch metric calculators positioned in Radix-4 branch metric calculator do not calculate a branch metric about a puncture generation part, this control action is controlled by four puncture position signals.

FIGS. 3 to 7 illustrate a detailed construction of the depuncture structure for Radix-4 branch metric calculation according to the present invention. Although FIGS. 3 to 7 describe a special case wherein a constraint length K of an original code is set to '7', the depuncturing structure of FIGS. 3~7 can be similarly applied to all constraint lengths.

A depuncturing process of a case including a code rate ½ under the condition that no puncture occurs will be described with reference to FIG. 3.

Transmitted bits are all bits of I and Q channels, as shown in FIG. 3(a). That is, all punctured patterns are '1' not '0', there is no punctured pattern in FIG. 3(a). Therefore, as shown in FIG. 3(b), all bits being ½ coded are transmitted. The transmitted bits being input to Radix-4 branch metric calculator are shown in FIG. 3(c). A unit time Ti shown in FIG. 3(c) is twice another unit time $t_i$ shown in (a)~(b) and (d)~(g) of FIG. 3, namely, $T_i - T_{i-1} = 2(t_i - t_{i-1})$.

FIG. 3(d) sequentially illustrates four control signals for writing I-bit or Q-bit in FIFO. At a timing point $t_1$, $I_1$-bit is written in $FIFO_0$, $Q_1$-bit is written in $FIFO_2$, and no bit is written in $FIFO_1$ and $FIFO_3$. At a timing point $t_2$, $I_2$-bit is written in $FIFO_1$, $Q_2$-bit is written in $FIFO_3$, and no bit is written in $FIFO_0$ and $FIFO_2$. In other words, a writing signal of each FIFO shown in FIG. 3(d) is input to a corresponding FIFO at a timing point at which $I_i$ or $Q_i$ exists.

FIG. 3(e) sequentially illustrates four control signals for reading a recorded content ($I_i$ or $Q_i$) of FIFO and outputting the recorded content. $FIFO_0$ stores $I_1$, $I_3$, $I_5$ . . . bits, and a reading timing point of the $FIFO_0$ is $t_2$, $t_4$, $t_6$ . . . timing points. Accordingly, at odd timing points such as $t_1$, $t_3$, $t_5$ . . . timing points, all FIFOs have no output signal. At even timing points such as $t_2$, $t_4$, $t_6$ . . . timing points, all FIFOs produce an output signal. The timing point $t_1$ of FIG. 3(e) is not identical with a timing point $t_1$ of FIG. 3(d), and is separated from the timing point $t_1$ of FIG. 3(d) by a predetermined time interval. But, a time elapsed from FIG. 3(e) to FIG. 3(g) is constant.

FIG. 3(f) sequentially illustrates four selection signals of 2:1 multiplexer. An output signal of the multiplexer should be controlled by considering a timing in order to generate $I_i$-bit and $Q_i$-bit that are equal to a bit stream shown in FIG. 3(c). $FIFO_0$ and $FIFO_2$ are connected to an input terminal of a multiplexer $Mux_0$. As shown in FIG. 2(a), if an input selection signal of the multiplexer $Mux_0$ is '0', $FIFO_0$ connected to an upper part of the multiplexer $Mux_0$ is selected. If an input selection signal of the multiplexer $Mux_0$ is '1', $FIFO_2$ connected to an upper part of the multiplexer $Mux_0$ is selected. In the multiplexer $Mux_0$, a selection signal of the multiplexer $Mux_0$ should be controlled to output a bit proposed in a first row of FIG. 3(c). That is, an output signal of the multiplexer $Mux_0$ should be $I_1$, $I_3$, $I_5$ . . . bits, and FIFO storing $I_1$, $I_3$, $I_5$ . . . bits is $FIFO_0$. As a result, an input selection signal of the multiplexer $Mux_0$ is to be '0' at $t_2$, $t_4$, $t_6$ . . . timing points.

Figure 4:
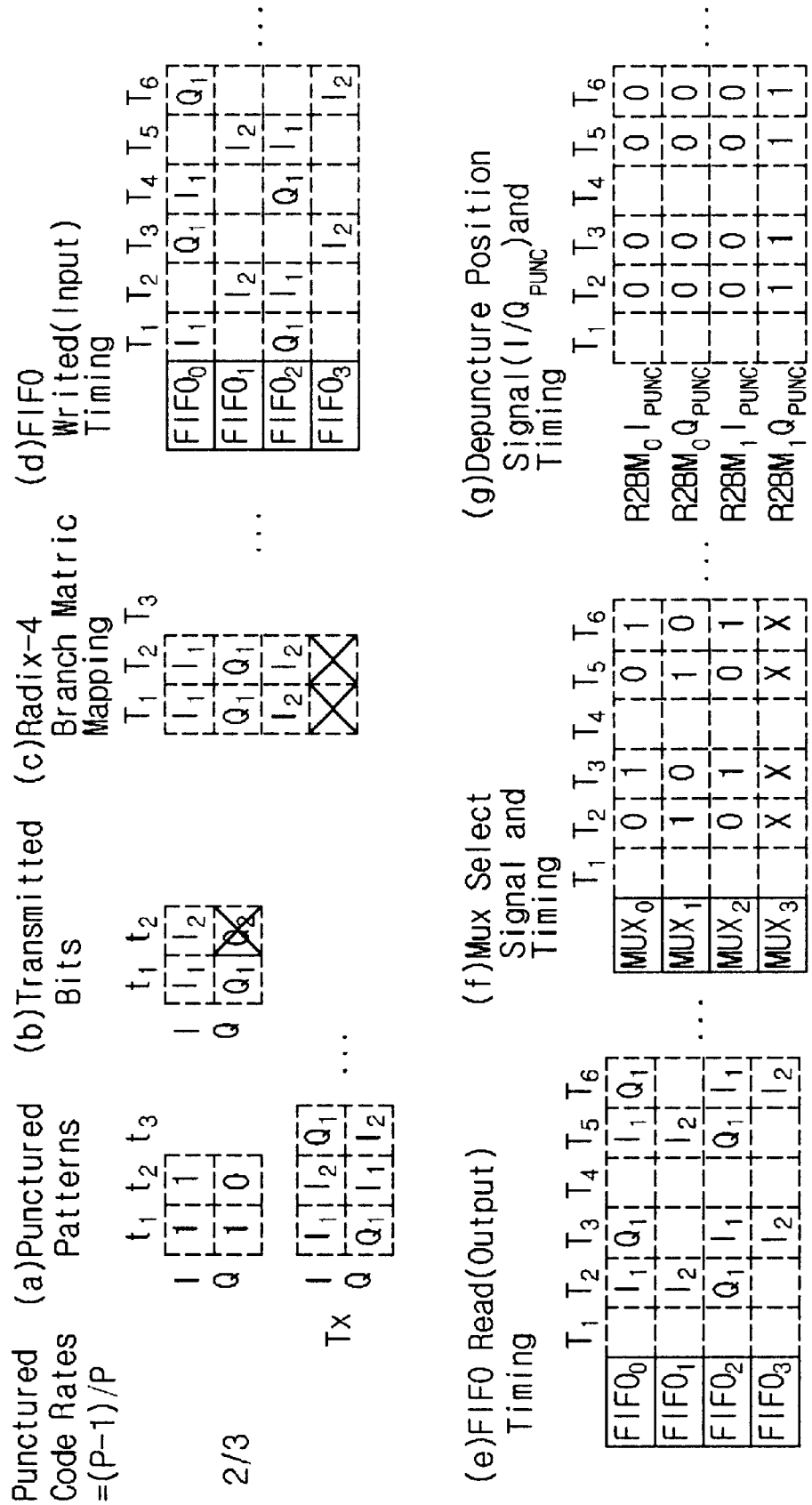

Hereinafter, a depuncturing process of an example case having a code rate ⅔ under the condition that no puncture occurs will be described with reference to FIG. 4 illustrating a depuncturing method about a case wherein a code rate of a punctured code is ⅔.

Referring to FIG. 4, transmitted bits are all bits of I-channel and a first bit of Q-channel as shown in FIG. 4(a), a puncture is repeated with a transmission period of 2-clocks. Namely, bits located at $t_2$, $t_4$, $t_6$ . . . timing points of the Q-channel are punctured and not transmitted. Therefore, if an input signal of 2-bits is transmitted to a coder, punctured bits of 3-bits are transmitted, thereby making a punctured code of a code rate ⅔ in the end. In order to express even puncture bits, FIG. 4(b) indicates two punctured patterns added to each other and also describes a periodically-repeated transmission pattern of total 6 bits. In other words, FIG. 4(b) describes a transmission pattern wherein a punctured pattern is arranged in two rows I and Q and is periodically transmitted. In FIG. 4(b), $I_1$ of the timing point $t_2$ is different from $I_1$ of the timing point $t_1$, and means another $I_1$ of the next punctured pattern.

Transmitted bits being input to Radix-4 branch metric calculator are shown in FIG. 4(c). A unit time $T_i$ shown in FIG. 4(c) is twice another unit time $t_i$ shown in (a)~(b) and (d)~(g) of FIG. 4, namely, $T_i - T_{i-1} = 2(t_i - t_{i-1})$.

FIG. 4(d) sequentially illustrates four control signals for writing I-bit or Q-bit in FIFO. At a timing point $t_1$, $I_1$-bit is written in $FIFO_0$, $Q_1$-bit is written in $FIFO_2$, and no bit is written in $FIFO_1$ and $FIFO_3$. At a timing point $t_2$, $I_2$-bit is written in $FIFO_1$, $I_1$-bit is written in $FIFO_2$, and no bit is written in $FIFO_0$ and $FIFO_3$. Here, $I_1$ of the timing point $t_2$ is different from $I_1$ of the timing point $t_1$, and means another $I_1$ of the next punctured pattern. At a timing point $t_3$, $Q_1$-bit of the next punctured pattern is written in $FIFO_0$, $I_2$-bit of the next punctured pattern is written in $FIFO_3$, and no bit is written in $FIFO_1$, and $FIFO_2$.

In other words, a writing signal of each FIFO shown in FIG. 4(d) is input to a corresponding FIFO at a timing point at which $I_i$ or $Q_i$ exists. A content to be written in FIFO for a time period of $t_4$~$t_6$ is equal to a time period of $t_1$~$t_3$, but FIG. 4(d) describes only FIFO contents of $t_4$~$t_6$ in order to indicate that the same content is repeated every three clocks.

FIG. 4(e) sequentially illustrates four control signals for reading a recorded content ($I_i$ or $Q_i$) of FIFO and outputting the recorded content. $FIFO_0$ stores $I_1$ of a timing point $t_1$ and $Q_1$ of a timing point $t_3$, stores $I_1$ being the next punctured pattern at a timing point $t_4$. A reading timing point of the $FIFO_0$ is $t_2$, $t_3$, $t_5$, $t_6$ . . . timing points. $FIFO_1$ stores $I_2$ of a timing point $t_2$, stores $I_2$ being the next punctured pattern of a timing point $t_5$. A reading timing point of the $FIFO_1$ is $t_2$, $t_5$ . . . timing points.

Accordingly, an output signal of each FIFO is controlled according to the above reading timing points. The timing point $t_1$ of FIG. 4(e) is not identical with a timing point $t_1$ of FIG. 4(d), and is separated from the timing point $t_1$ of FIG. 4(d) by a predetermined time interval. But, a time elapsed from FIG. 4(e) to FIG. 4(g) is constant.

FIG. 4(f) sequentially illustrates four selection signals of 2:1 multiplexer. An output signal of the multiplexer should be controlled by considering a timing in order to generate $I_i$-bit and $Q_i$-bit that are equal to a bit stream shown in FIG. 4(c). $FIFO_0$ and $FIFO_2$ are connected to an input terminal of a multiplexer $Mux_0$. In the multiplexer $Mux_0$, a selection signal of the multiplexer $Mux_0$ should be controlled to output a bit proposed in a first row of FIG. 4(c). The multiplexer $Mux_0$ does not produce an output signal at the timing point $t_1$, produces $I_1$ at the timing point $t_2$, and produces $I_1$ of the next punctured pattern at the timing point $t_2$. As a result, an input selection signal of the multiplexer $Mux_0$ is to be '0', '1', '0', '1' . . . at $t_2$, $t_3$, $t_5$, $t_6$ . . . timing points.

Figure 5:
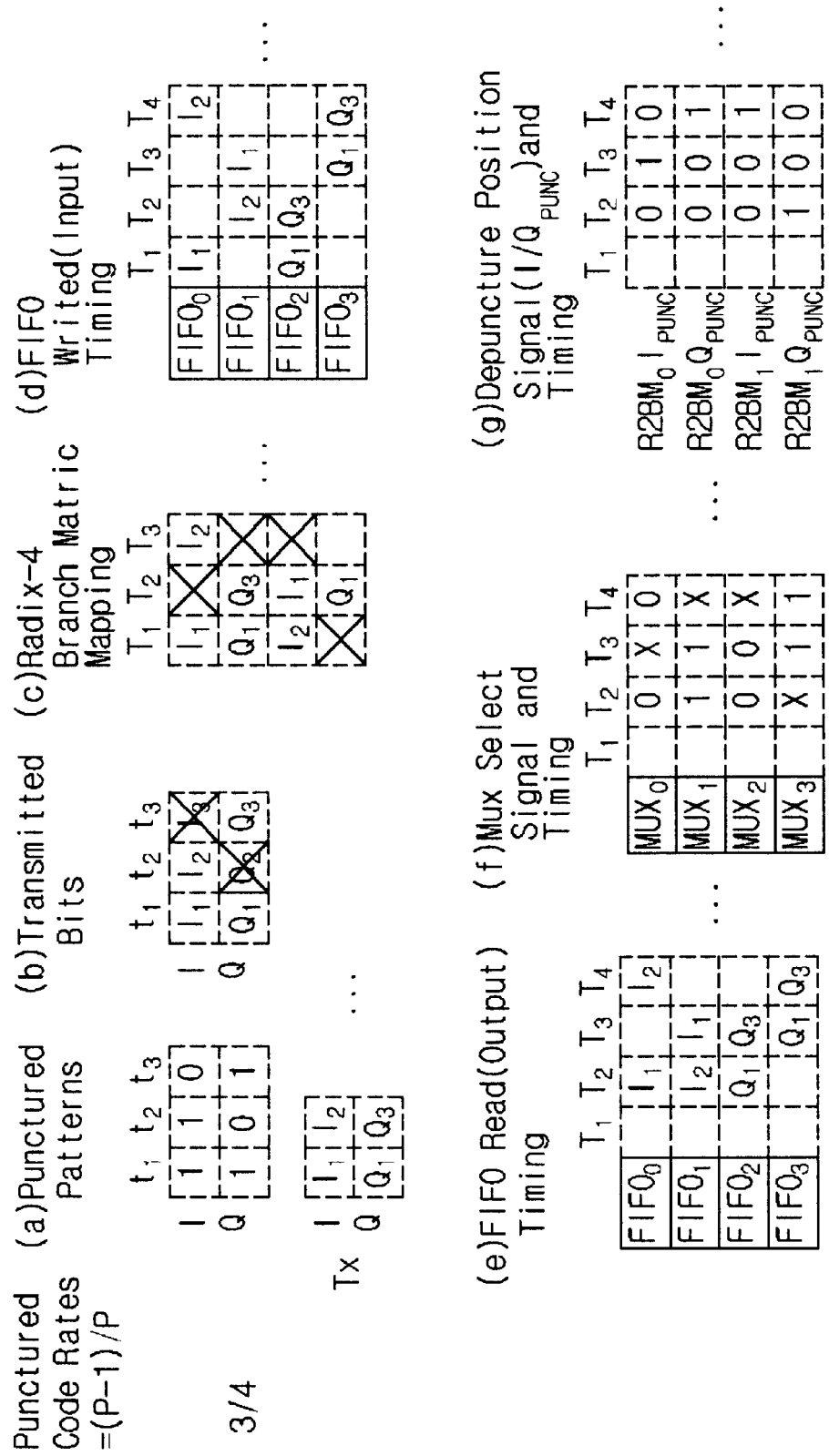

Hereinafter, a depuncturing process of an example case having a code rate ¾ under the condition that no puncture occurs will be described with reference to FIG. 5 illustrating a depuncturing method about a case wherein a code rate of a punctured code is ¾.

Referring to FIG. 5, transmitted bits are a first bit and a second bit in case of I-channel, and are a first bit and a third bit in case of Q-channel. A puncture is repeated with a transmission period of 3-clocks. Namely, bits located at $t_3$, $t_6$, $t_9$ . . . timing points of the I-channel are punctured, bits located at $t_2$, $t_4$, $t_6$ . . . timing points of the Q-channel are punctured, so that the punctured bits are not transmitted. Therefore, if an input signal of 3-bits is transmitted to a coder, punctured bits of 4-bits are transmitted, thereby making a punctured code of a code rate ¾ in the end.

FIG. 5(b) illustrates a transmission pattern wherein a punctured pattern is arranged in two rows I and Q and is periodically transmitted. Transmitted bits being input to Radix-4 branch metric calculator are shown in FIG. 5(c). A unit time Ti shown in FIG. 5(c) is twice another unit time $t_i$ shown in (a)~(b) and (d)~(g) of FIG. 5, namely, $T_i-T_{i-1}=2(t_i-t_{i-1})$.

FIG. 5(d) sequentially illustrates four control signals for writing I-bit or Q-bit in FIFO. At a timing point $t_1$, $I_1$-bit is written in $FIFO_0$, $Q_1$-bit is written in $FIFO_2$, and no bit is written in $FIFO_1$ and $FIFO_3$. At a timing point $t_2$, $I_2$-bit is written in $FIFO_1$, $Q_3$-bit is written in $FIFO_2$, and no bit is written in $FIFO_0$ and $FIFO_3$. Since the next punctured pattern starts at a timing point $t_3$, $I_1$ and $Q_1$ of the timing point $t_3$ are different from $I_1$ and $Q_1$ of the timing point $t_1$. At the timing point $t_3$, $I_1$-bit of the next punctured pattern is written in $FIFO_1$, $Q_1$-bit of the next punctured pattern is written in $FIFO_3$, and no bit is written in $FIFO_0$ and $FIFO_2$. In other words, a writing signal of each FIFO shown in FIG. 5(d) is input to a corresponding FIFO at a timing point at which $I_i$ or $Q_i$ exists.

FIG. 5(e) sequentially illustrates four control signals for reading a recorded content ($I_i$ or $Q_i$) of FIFO and outputting the recorded content. $FIFO_0$ stores $I_1$ of a timing point $t_1$ and $I_2$ of a timing point $t_4$. A reading timing point of the $FIFO_0$ is $t_2, t_4, t_6, t_8 \ldots$ timing points. $FIFO_1$ stores $I_2$ of a timing point $t_2$ and $I_1$ of a timing point $t_3$. A reading timing point of the $FIFO_1$ is $t_2, t_3, t_6, t_7 \ldots$ timing points.

Accordingly, an output signal of each FIFO is controlled according to the above reading timing points. The timing point $t_1$ of FIG. 5(e) is not identical with a timing point $t_1$ of FIG. 5(d), and is separated from the timing point $t_1$ of FIG. 5(d) by a predetermined time interval. But, a time elapsed from FIG. 5(e) to FIG. 5(g) is constant.

FIG. 5(f) sequentially illustrates four selection signals of 2:1 multiplexer. An output signal of the multiplexer should be controlled by considering a timing in order to generate $I_i$-bit and $Q_i$-bit that are equal to a bit stream shown in FIG. 5(c). $FIFO_0$ and $FIFO_2$ are connected to an input terminal of a multiplexer $Mux_0$. In the multiplexer $Mux_0$, a selection signal of the multiplexer $Mux_0$ should be controlled to output a bit proposed in a first row of FIG. 5(c). The multiplexer $Mux_0$ does not produce an output signal at the timing point $t_1$, and produces $I_1$ at the timing point $t_2$. At a timing point $t_3$ indicated as 'X' meaning "don't care", an output signal of the multiplexer $Mux_0$ is not used for Radix-4 branch metric calculator regardless of an output content. The multiplexer $Mux_0$ produces $I_2$ of the next punctured pattern at the timing point $t_4$. As a result, an input selection signal of the multiplexer $Mux_0$ is to be '0', 'X', '0', '0', 'X', '0' . . . at $t_2, t_3, t_4, t_6, t_7, t_8 \ldots$ timing points.

Figure 6:
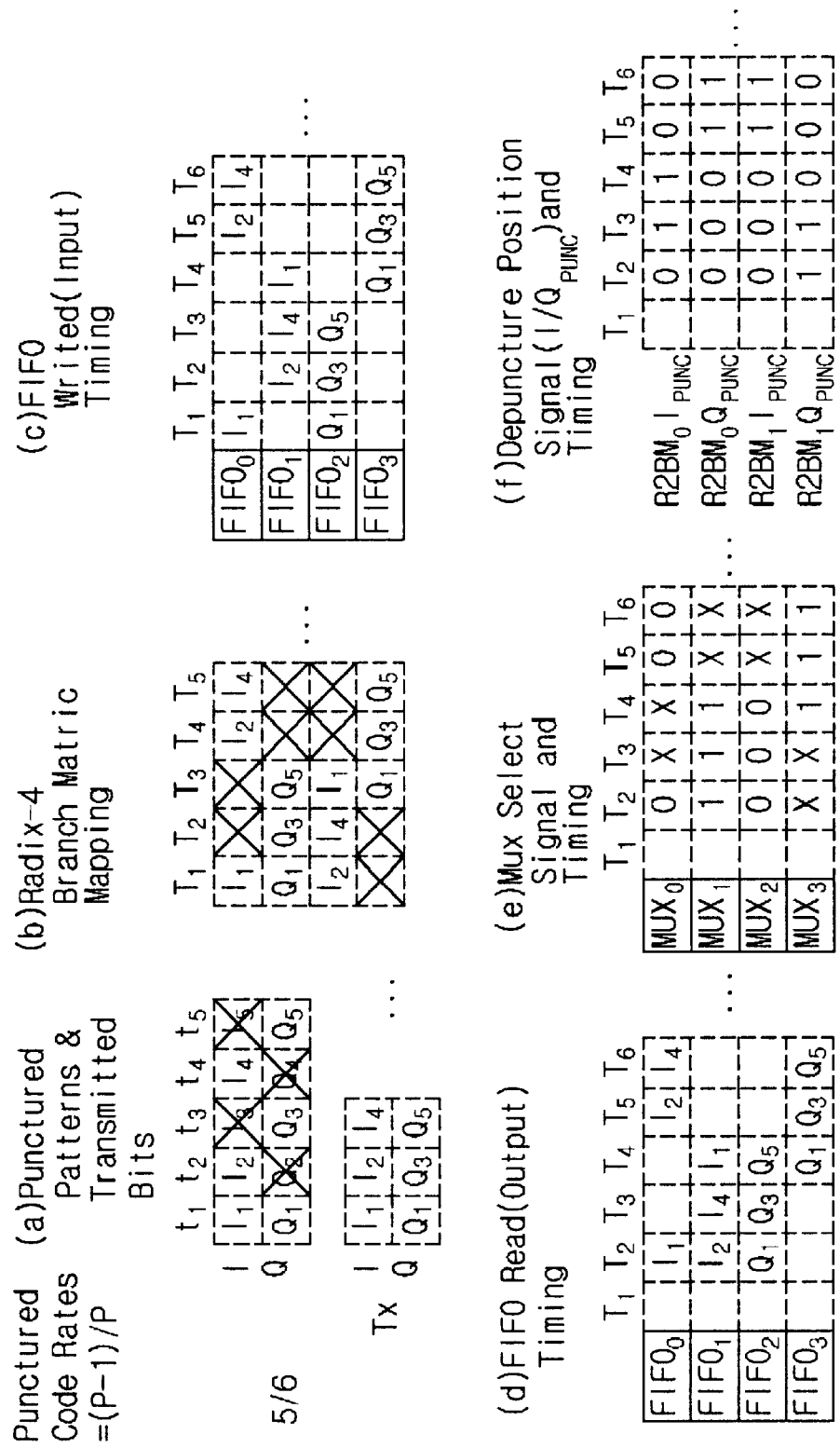

Hereinafter, a depuncturing process of an example case having a code rate ⅚ under the condition that no puncture occurs will be described with reference to FIG. 6 illustrating a depuncturing method about a case wherein a code rate of a punctured code is ⅚.

Referring to FIG. 6(a), transmitted bits are a first bit, a second bit and a fourth bit in case of I-channel, and are a first bit, a third bit and a fifth bit in case of Q-channel. A puncture is repeated with a transmission period of 5-clocks. Namely, bits located at $t_3, t_5 \ldots$ timing points of the I-channel are punctured, bits located at $t_2, t_4 \ldots$ timing points of the Q-channel are punctured, so that the punctured bits are not transmitted. Therefore, if an input signal of 5-bits is transmitted to a coder, punctured bits of 6-bits are transmitted, thereby making a punctured code of a code rate ⅚ in the end.

FIG. 6(a) illustrates a transmission pattern wherein a punctured pattern is arranged in two rows I and Q and is periodically transmitted. Transmitted bits being input to Radix-4 branch metric calculator are shown in FIG. 6(b). A unit time Ti shown in FIG. 6(b) is twice another unit time $t_i$ shown in (a), and (c)~(f) of FIG. 6, namely, $T_i-T_{i-1}=2(t_i-t_{i-1})$.

FIG. 6(c) sequentially illustrates four control signals for writing I-bit or Q-bit in FIFO. At a timing point $t_1$, $I_1$-bit is written in $FIFO_0$, $Q_1$-bit is written in $FIFO_2$, and no bit is written in $FIFO_1$, and $FIFO_3$. At a timing point $t_2$, $I_2$-bit is written in $FIFO_1$, $Q_3$-bit is written in $FIFO_2$, and no bit is written in $FIFO_0$ and $FIFO_3$. At a timing point $t_3$, $I_4$-bit is written in $FIFO_1$, $Q_5$-bit is written in $FIFO_2$, and no bit is written in $FIFO_0$ and $FIFO_3$. Since the next punctured pattern starts at a timing point $t_4$, $I_1$ and $Q_1$ of the timing point $t_4$ are different from $I_1$ and $Q_1$ of the timing point $t_1$. At the timing point $t_4$, $I_1$-bit of the next punctured pattern is written in $FIFO_1$, $Q_1$-bit of the next punctured pattern is written in $FIFO_3$, and no bit is written in $FIFO_0$ and $FIFO_2$. In other words, a writing signal of each FIFO shown in FIG. 6(c) is input to a corresponding FIFO at a timing point at which $I_i$ or $Q_i$ exists.

FIG. 6(d) sequentially illustrates four control signals for reading a recorded content ($I_i$ or $Q_i$) of FIFO and outputting the recorded content. $FIFO_0$ stores $I_1$ of a timing point $t_1$, $I_2$ of a timing point $t_5$, and $I_4$ of a timing point $t_6$. A reading timing point of the $FIFO_0$ is $t_2, t_5, t_6 \ldots$ timing points. $FIFO_1$ stores $I_2$ of a timing point $t_2$ and $I_1$ of a timing point $t_3$. A reading timing point of the $FIFO_1$ is $t_2, t_3, t_6, t_7 \ldots$ timing points.

Accordingly, an output signal of each FIFO is controlled according to the above reading timing points. The timing point $t_1$ of FIG. 6(d) is not identical with a timing point $t_1$ of FIG. 6(c), and is separated from the timing point $t_1$ of FIG. 6(c) by a predetermined time interval. But, a time elapsed from FIG. 6(d) to FIG. 6(f) is constant.

FIG. 6(e) sequentially illustrates four selection signals of 2:1 multiplexer. An output signal of the multiplexer should be controlled by considering a timing in order to generate $I_i$-bit and $Q_i$-bit that are equal to a bit stream shown in FIG. 6(b). $FIFO_0$ and $FIFO_2$ are connected to an input terminal of a multiplexer $Mux_0$. In the multiplexer $Mux_0$, a selection signal of the multiplexer $Mux_0$ should be controlled to output a bit proposed in a first row of FIG. 6(b). The multiplexer $Mux_0$ does not produce an output signal at the timing point $t_1$, and produces $I_1$ at the timing point $t_2$. At the timing points $t_3$ and $t_4$ indicated as 'X' meaning "don't care", output signals of the multiplexer $Mux_0$ are not used for Radix-4 branch metric calculator regardless of an output content. The multiplexer $Mux_0$ produces $I_2$ at the timing point $t_5$, and produces $I_4$ at the timing point $t_5$. As a result, an input selection signal of the multiplexer $Mux_0$ is to be '0', 'X', 'X' '0', '0', '0', 'X', 'X' . . . at $t_2, t_3, t_4, t_5, t_6, t_8, t_9$, bx;$1_{10} \ldots$ timing points.

Hereinafter, a depuncturing process of an example case having a code rate ⅞ under the condition that no puncture occurs will be described with reference to FIG. 7 illustrating a depuncturing method about a case wherein a code rate of a punctured code is ⅞.

Referring to FIG. 7(a), transmitted bits are a first to fourth bits, and a sixth bit in case of I-channel, and are a first bit, a fifth bit and a seventh bit in case of Q-channel. A puncture is repeated with a transmission period of 7-clocks. Namely, bits located at $t_5, t_7, t_{12}, t_{14} \ldots$ timing points of the I-channel are punctured, bits located at $t_2, t_3, t_4, t_6, t_9, t_{10}, t_{11}, t_{13}, \ldots$ timing points of the Q-channel are punctured, so that the punctured bits are not transmitted. Therefore, if an input signal of 7-bits is transmitted to a coder, punctured bits of 8-bits are transmitted, thereby making a punctured code of a code rate ⅞ in the end.

FIG. 7(a) illustrates a transmission pattern wherein a punctured pattern is arranged in two rows I and Q and is periodically transmitted. Transmitted bits being input to Radix-4 branch metric calculator are shown in FIG. 7(b). A unit time Ti shown in FIG. 7(b) is twice another unit time $t_i$ shown in (a), and (c)~(f) of FIG. 7, namely, $T_i - T_{i-1} = 2(t_i - t_{i-1})$.

FIG. 7(c) sequentially illustrates four control signals for writing I-bit or Q-bit in FIFO. At a timing point $t_1$, $I_1$-bit is written in $FIFO_0$, $Q_1$-bit is written in $FIFO_2$, and no bit is written in $FIFO_1$ and $FIFO_3$. At a timing point $t_2$, $I_2$-bit is written in $FIFO_1$, $I_3$-bit is written in $FIFO_2$, and no bit is written in $FIFO_0$ and $FIFO_3$. At a timing point $t_3$, $I_4$-bit is written in $FIFO_1$, $Q_5$-bit is written in $FIFO_2$, and no bit is written in $FIFO_0$ and $FIFO_3$. At a timing point $t_4$, $I_6$-bit is written in $FIFO_1$, $Q_7$-bit is written in $FIFO_2$, and no bit is written in $FIFO_0$ and $FIFO_3$. Since the next punctured pattern starts at a timing point $t_5$, $I_1$ and $Q_1$ of the timing point $t_5$ are different from $I_1$ and $Q_1$ of the timing point $t_1$. At the timing point $t_5$, $I_1$-bit of the next punctured pattern is written in $FIFO_1$, $Q_1$-bit of the next punctured pattern is written in $FIFO_3$, and no bit is written in $FIFO_0$ and $FIFO_2$.

In other words, a writing signal of each FIFO shown in FIG. 7(c) is input to a corresponding FIFO at a timing point at which $I_i$ or $Q_i$ exists.

FIG. 7(d) sequentially illustrates four control signals for reading a recorded content ($I_i$ or $Q_i$) of FIFO and outputting the recorded content. $FIFO_0$ stores $I_1$ of a timing point $t_1$, $I_2$ of a timing point $t_6$, $I_4$ of a timing point $t_7$, and $I_6$ of a timing point $t_8$. A reading timing point of the $FIFO_0$ is $t_2, t_6, t_7, t_8 \ldots$ timing points. $FIFO_1$ stores $I_2$ of a timing point $t_2$, $I_4$ of a timing point $t_3$, and $I_6$ of a timing point $t_4$. A reading timing point of the $FIFO_1$ is $t_2, t_3, t_4 \ldots$ timing points.

Accordingly, an output signal of each FIFO is controlled according to the above reading timing points. The timing point $t_1$ of FIG. 7(d) is not identical with a timing point $t_1$ of FIG. 7(c), and is separated from the timing point $t_1$ of FIG. 7(c) by a predetermined time interval. But, a time elapsed from FIG. 7(d) to FIG. 7(f) is constant.

FIG. 7(e) sequentially illustrates four selection signals of 2:1 multiplexer. An output signal of the multiplexer should be controlled by considering a timing in order to generate $I_i$-bit and $Q_i$-bit that are equal to a bit stream shown in FIG. 7(b). $FIFO_0$ and $FIFO_2$ are connected to an input terminal of a multiplexer $Mux_0$. In the multiplexer $Mux_0$, a selection signal of the multiplexer $Mux_0$ should be controlled to output a bit proposed in a first row of FIG. 7(b). The multiplexer $Mux_0$ does not produce an output signal at the timing point $t_1$, produces $I_1$ at the timing point $t_2$, and produces $I_3$ at the timing point $t_3$. At the timing points $t_4$ and $t_5$ indicated as 'X' meaning "don't care", output signals of the multiplexer $Mux_0$ are not used for Radix-4 branch metric calculator regardless of an output content. The multiplexer $Mux_0$ produces $I_2$ at the timing point $t_6$, $I_4$ at the timing point $t_7$, and produces $I_6$ at the timing point $t_8$. As a result, an input selection signal of the multiplexer $Mux_0$ is to be '0', '1', 'X', 'X', '0', '0', '0', '0', '1', . . . at $t_2, t_3, t_4, t_5, t_6, t_7, t_8, t_{10}, t_{11} \ldots$ timing points.

As described above, a structure and a method for depuncturing the punctured codes for Radix-4 branch metric calculation in a high-speed Viterbi decoder in accordance with a preferred embodiment of the present invention simply process an input bit stream being input to a Viterbi decoder designed by using a Radix-4 branch metric calculator, and then depuncture the input bit stream.

It is understood that various other modifications will be apparent to and can be readily made by those skilled in the art without departing from the scope and spirit of the invention. Accordingly, it is not intended that the scope of the claims appended hereto to be limited to the description as set forth herein, but rather that the claims be construed as encompassing all the features of patentable novelty that reside in the present invention, including all features that would be treated as equivalents thereof by those skilled in the art which this invention pertains.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A depuncture structure for Radix-4 branch metric calculation in a high-speed Viterbi decoder, comprising:
   first and second FIFOs (first-input-first-outputs) for sequentially receiving I-signal, and storing the I-signal;
   third and fourth FIFOs for sequentially receiving Q-signal, and storing the Q-signal;
   first and second multiplexers for receiving output signals of the first and third FIFOs, and multiplexing them;
   third and fourth multiplexers for receiving output signals of the second and fourth FIFOs, and multiplexing them;
   a first Radix-2 branch metric calculator for receiving output signals of the first and second multiplexers, and performing a depuncturing function about them; and
   a second Radix-2 branch metric calculator for receiving output signals of the third and fourth multiplexers, and performing a depuncturing function about them.

2. The depuncture structure for Radix-4 branch metric calculation in a high-speed Viterbi decoder according to claim 1, further comprising:
   a control signal generator which outputs four control signals for controlling a writing or a reading action of the first to fourth FIFOs, four control signals for selecting an input signal of the first to fourth multiplexers, and four control signals for selecting a depunctured bit position of the first and second Radix-2 branch metric calculators.

3. A depuncture method for Radix-4 branch metric calculation in a high-speed Viterbi decoder including four FIFOs (first-input-first-outputs), four multiplexers, and two Radix-2 branch metric calculators, comprising the steps of:
   (a) arranging a puncture pattern of a code rate (n−1)/n transmitting a punctured bit of n bits about an input of (n−1) bit in two rows I and Q, and periodically transmitting the puncture pattern arranged in the I and Q rows;
   (b) sequentially receiving I-signal and Q-signal of the puncture pattern, alternately storing the I-signal and the Q-signal in two FIFOs, and simultaneously reading a data from the four FIFOs when the data is stored in the four FIFOs;
   (c) multiplexing the data read from the four FIFOs, and outputting the data; and
   (d) receiving the multiplexed data, and performing Radix-2 branch metric calculation about the multiplexed data.

4. The depuncture method for Radix-4 branch metric calculation in a high-speed Viterbi decoder according to claim 3, wherein the step (a) when a punctured pattern of a code rate ½ in a state that a puncture does not occur is received, includes the steps of:

writing $I_1$-bit and $Q_1$-bit in a first FIFO and a third FIFO at a timing point $t_n$ (where, n is a given positive integer);

writing $I_1$-bit and $Q_1$-bit of the next punctured pattern in a second FIFO and a fourth FIFO at a timing point $t_{n+1}$; and if a data is written in the first to fourth FIFOs, simultaneously reading the data.

5. The depuncture method for Radix-4 branch metric calculation in a high-speed Viterbi decoder according to claim 3, wherein the step (a) when a punctured pattern of a code rate ⅔ is received, includes the steps of:

writing $I_1$-bit and $Q_1$-bit in a first FIFO and a third FIFO at a timing point $t_{2n-1}$ (where, n is a given positive integer);

writing $I_2$-bit and $Q_2$-bit in a second FIFO and a fourth FIFO at a timing point $t_{2n}$, and writing a punctured bit as a bit state of "don't care"; and if a data is written in the first to fourth FIFOs, simultaneously reading the data.

6. The depuncture method for Radix-4 branch metric calculation in a high-speed Viterbi decoder according to claim 3, wherein the step (a) when a punctured pattern of a code rate ¾ is received, includes the steps of:

writing $I_1$-bit and $Q_1$-bit in either first and third FIFOs or second and fourth FIFOs at a timing point $t_{3n-2}$ (where, n is a given positive integer);

writing $I_2$-bit and $Q_2$-bit in either second and fourth FIFOs or first and third FIFOs at a timing point $t_{3n-1}$;

writing $I_3$-bit or $Q_3$-bit in either first and third FIFOs or second and fourth FIFOs at a timing point $t_{3n}$, and writing a punctured bit as a bit state of "don't care"; and if a data is written in the first to fourth FIFOs, simultaneously reading the data.

7. The depuncture method for Radix-4 branch metric calculation in a high-speed Viterbi decoder according to claim 3, wherein the step (a) when a punctured pattern of a code rate ⅚ is received, includes the steps of:

writing $I_1$-bit and $Q_1$-bit in either first and third FIFOs or second and fourth FIFOs at a timing point $t_{5n-4}$ (where, n is a given positive integer);

writing $I_2$-bit and $Q_2$-bit in either second and fourth FIFOs or first and third FIFOs at a timing point $t_{5n-3}$;

writing $I_3$-bit or $Q_3$-bit in either first and third FIFOs or second and fourth FIFOs at a timing point $t_{5n-2}$;

writing $I_4$-bit and $Q_4$-bit in either second and fourth FIFOs or first and third FIFOs at a timing point $t_{5n-1}$;

writing $I_5$-bit or $Q_5$-bit in either first and third FIFOs or second and fourth FIFOs at a timing point $t_{5n}$, and writing a punctured bit as a bit state of "don't care"; and if a data is written in the first to fourth FIFOs, simultaneously reading the data.

8. The depuncture method for Radix-4 branch metric calculation in a high-speed Viterbi decoder according to claim 3, wherein the step (a) when a punctured pattern of a code rate ⅞ is received, includes the steps of:

writing $I_1$-bit and $Q_1$-bit in either first and third FIFOs or second and fourth FIFOs at a timing point $t_{7n-6}$ (where, n is a given positive integer);

writing $I_2$-bit and $Q_2$-bit in either second and fourth FIFOs or first and third FIFOs at a timing point $t_{7n-5}$;

writing $I_3$-bit or $Q_3$-bit in either first and third FIFOs or second and fourth FIFOs at a timing point $t_{7n-4}$;

writing $I_4$-bit and $Q_4$-bit in either second and fourth FIFOs or first and third FIFOs at a timing point $t_{7n-3}$;

writing $I_5$-bit or $Q_5$-bit in either first and third FIFOs or second and fourth FIFOs at a timing point $t_{7n-2}$;

writing $I_6$-bit and $Q_6$-bit in either second and fourth FIFOs or first and third FIFOs at a timing point $t_{7n-1}$;

writing $I_7$-bit or $Q_7$-bit in either first and third FIFOs or second and fourth FIFOs at a timing point $t_{7n}$, and writing a punctured bit as a bit state of "don't care"; and if a data is written in the first to fourth FIFOs, simultaneously reading the data.

\* \* \* \* \*